United States Patent
Lin

(10) Patent No.: US 11,303,283 B2
(45) Date of Patent: Apr. 12, 2022

(54) CLOCK AND DATA RECOVERY CIRCUITRY WITH ASYMMETRICAL CHARGE PUMP

(71) Applicant: ARTILUX, INC., Menlo Park, CA (US)

(72) Inventor: Shao-Hung Lin, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 0 days.

(21) Appl. No.: 17/143,431

(22) Filed: Jan. 7, 2021

(65) Prior Publication Data

US 2021/0218405 A1    Jul. 15, 2021

Related U.S. Application Data

(60) Provisional application No. 62/960,650, filed on Jan. 13, 2020.

(51) Int. Cl.
| | |
|---|---|
| H03D 3/24 | (2006.01) |
| H03L 7/089 | (2006.01) |
| H04L 7/033 | (2006.01) |
| H03L 7/08 | (2006.01) |
| H03L 7/099 | (2006.01) |

(52) U.S. Cl.
CPC .......... *H03L 7/0891* (2013.01); *H03L 7/0807* (2013.01); *H03L 7/099* (2013.01); *H04L 7/0331* (2013.01)

(58) Field of Classification Search
CPC ..... H03L 7/0891; H03L 7/0807; H03L 7/099; H04L 7/0331

USPC ................. 375/373–376, 326, 327
See application file for complete search history.

(56) References Cited

U.S. PATENT DOCUMENTS

| | | |
|---|---|---|
| 7,205,852 B2 | 4/2007 | Perrott |
| 7,375,591 B2 | 5/2008 | Fu et al. |
| 7,512,203 B2 | 3/2009 | Eldredge et al. |
| 7,612,625 B2 | 11/2009 | Gao et al. |
| 7,692,501 B2 | 4/2010 | Hsueh et al. |
| 8,804,892 B2 | 8/2014 | Kyles |
| 9,178,684 B2 | 11/2015 | Nguyen |
| 9,287,883 B2 | 3/2016 | Shibasaki et al. |
| 9,325,490 B2 | 4/2016 | Tiwari et al. |
| 9,525,544 B2 | 12/2016 | Green et al. |
| 9,768,789 B2 | 9/2017 | Bae et al. |
| 10,291,241 B2 | 5/2019 | Wang et al. |

(Continued)

*Primary Examiner* — Phuong Phu
(74) *Attorney, Agent, or Firm* — Perkins Coie LLP

(57) ABSTRACT

Introduced here are techniques for implementing a clock and data recovery circuit with improved tendencies, such a pull up and/or pull down tendencies. In various embodiments, the CDR circuit includes a phase detector that receives an input signal and a output reference clock signal. The phase detector then outputs two signals to charge pump. The output from the charge pump drives an oscillator control voltage up or down depending the current from the charge pump. A lock detector detects whether a lock has occurred by comparing the oscillator control voltage to a predetermined threshold voltage. A lock can occur when the circuit has settled into a frequency substantially near the frequency of the input signal and the oscillator control voltage is substantially near the threshold voltage. A controller circuit can control a sweeping of an available frequency range by the circuit until a lock occurs.

20 Claims, 6 Drawing Sheets

(56) References Cited

U.S. PATENT DOCUMENTS 10,819,348 B2 10/2020 Chen
2014/0320184 A1* 10/2014 Chen .................... H03L 7/0891
327/157

* cited by examiner

CLOCK AND DATA RECOVERY CIRCUITRY WITH ASYMMETRICAL CHARGE PUMP

CROSS-REFERENCE TO RELATED APPLICATION(S)

This application claims benefit of U.S. Provisional Application No. 62/960,650, titled "Clock and Data Recovery (CDR) Circuit Using Unsymmetrical Charge Pump" and filed on Jan. 13, 2020, which is hereby incorporated by reference in its entirety.

TECHNICAL FIELD

This present disclosure is directed generally to circuit design, and more specifically, to clock and data recovery circuits.

BACKGROUND

Communication systems are constantly being improved to account for the need to increase data transmission rates while also reducing the overhead. One such improvement commonly used is to transmit data without a reference clock. The receiver, then, is required to process the data asynchronously to recover the clock and data without the reference clock. The receiver can include a clock and data recovery (CDR) circuit for asynchronous data processing. The CDR circuit uses a frequency detector to track the input data rate and match the frequency of a voltage-controlled oscillator to the input data rate. Further, the CDR can use a phase detector to detect the phrase difference between the input data rate and the generated clock, and lock phases accordingly. By doing so, a CDR can match the frequency of the output signal with the input signal. However, traditional frequency detectors consume a lot of power and cause a heavy load on the system because they operate at high frequencies.

Accordingly, there remains a need for improved CDR circuits, for example, one that can achieve a wide frequency rage while being capable of operating at reduced power consumption.

SUMMARY

The following summary is provided for the convenience of the reader and identifies several representative embodiments of the disclosed techniques.

A circuit for clock and data recovery (CDR) in accordance with a representative embodiment can operate with asymmetrical charge pumps to sweep a number of frequency ranges, without a crystal and without a frequency detector. The representative embodiment can include a phase detector configured to generate one or more charge pump control signals based on a phase difference between an input signal and an output clock signal. The representative embodiment can also include a charge pump comprising a first current source configured to pull up an oscillator control signal towards a first predetermined voltage; and a second current source configured to pull down the oscillator control signal towards a second predetermined voltage. The charge pump to pull up or pull down the oscillator control signal toward the first predetermined voltage or the second predetermined voltage in response to the one or more charge pump control signals. The first current source can be configured to generate a first driving current and the second current source can be configured to generate a second driving current that is different from the first driving current.

The representative embodiment can also include a voltage-controlled oscillator (VCO) configured to generate the output clock signal based on the oscillator control signal, and a lock detector configured to detect a lock status based on a comparison between the oscillator control signal and a VCO reference voltage. Further, the representative embodiment can include a control circuit configured to selectively switch a first frequency band of the VCO to a second frequency band based on the lock status, wherein the first frequency band of the VCO corresponds to a first range of frequencies associated with the output clock signal, and wherein the second frequency band of the VCO corresponds to a second range of frequencies associated with the output clock signal that are different from the first range. In some embodiments, the first and second current sources can have at least a 20% difference in amplitude in their respective driving currents.

In some embodiments, the charge pump can be configured to cause the VCO to sweep through frequencies available in the first frequency band before switching to the second frequency band by driving the oscillator control signal from the first predetermined voltage to the second predetermined voltage. The second frequency band can be the frequency band with a starting frequency that is the closest to a starting frequency of the first frequency band. Further still, in some embodiments, the current source within the charge pump can be arranged so that the charge pump has a pull down tendency, and the initial frequency band can be one that has the highest starting frequency among all available frequency bands. In this case, the lock detector can be configured to detect that the circuit is locked when the circuit is settled, and the oscillator control signal is higher than the VCO reference voltage. Further, the highest available oscillator control signal for each frequency band of the available frequency bands can be the first predetermined voltage, and the VCO reference voltage can be ½ the first predetermined voltage.

In some embodiments, the current sources can be arranged so that the charge pump has a pull up tendency. In this case, the initial frequency band can be one that has the lowest starting frequency among all available frequency bands. The lock detector can, then, detect that the circuit is locked when the circuit is settled, and the oscillator[[−]] control signal is lower than the VCO reference voltage. The lowest available oscillator control signal for each frequency band of the available frequency bands can be the second predetermined voltage, and the VCO reference voltage is ½ the first predetermined voltage.

In some variations, all the available frequency bands together represent a total operable frequency range of the circuit. Further, in a number of examples, the VCO reference voltage can be ½ the first predetermined voltage. The VCO reference voltage, moreover, can be adjustable. For instance, the VCO reference voltage can be adjusted when a difference between the oscillator control signal and the VCO reference voltage is higher than a threshold.

The lock detector, in some variations, can include a comparator. The control circuit, in a number of examples, can be configured to start a frequency sweep by setting the first frequency band of the VCO to an initial frequency band, and the oscillator control signal to the first predetermined voltage. The control circuit, additionally, can be configured to, when the VCO switches to the second frequency band, set the oscillator control signal back to the first predetermined voltage. Moreover, after sweeping all the available frequency bands, the control circuit can be configured to reset the VCO back to the initial frequency band to start a second frequency sweep.

In some embodiments, the control circuit can be configured to detect whether the circuit has settled based on a comparison between the frequency of the output clock signal and the frequency of the input signal. Further, the control circuit can be configured to detect that the circuit has settled when the frequency of the output clock signal is substantially equal to the frequency of the input signal.

BRIEF DESCRIPTION OF THE DRAWINGS

One or more embodiments of the present disclosure are illustrated by way of example and not limitation in the figures of the accompanying drawings, in which like references indicate similar elements. These drawings are not necessarily drawn to scale.

DETAILED DESCRIPTION

Figure 1:
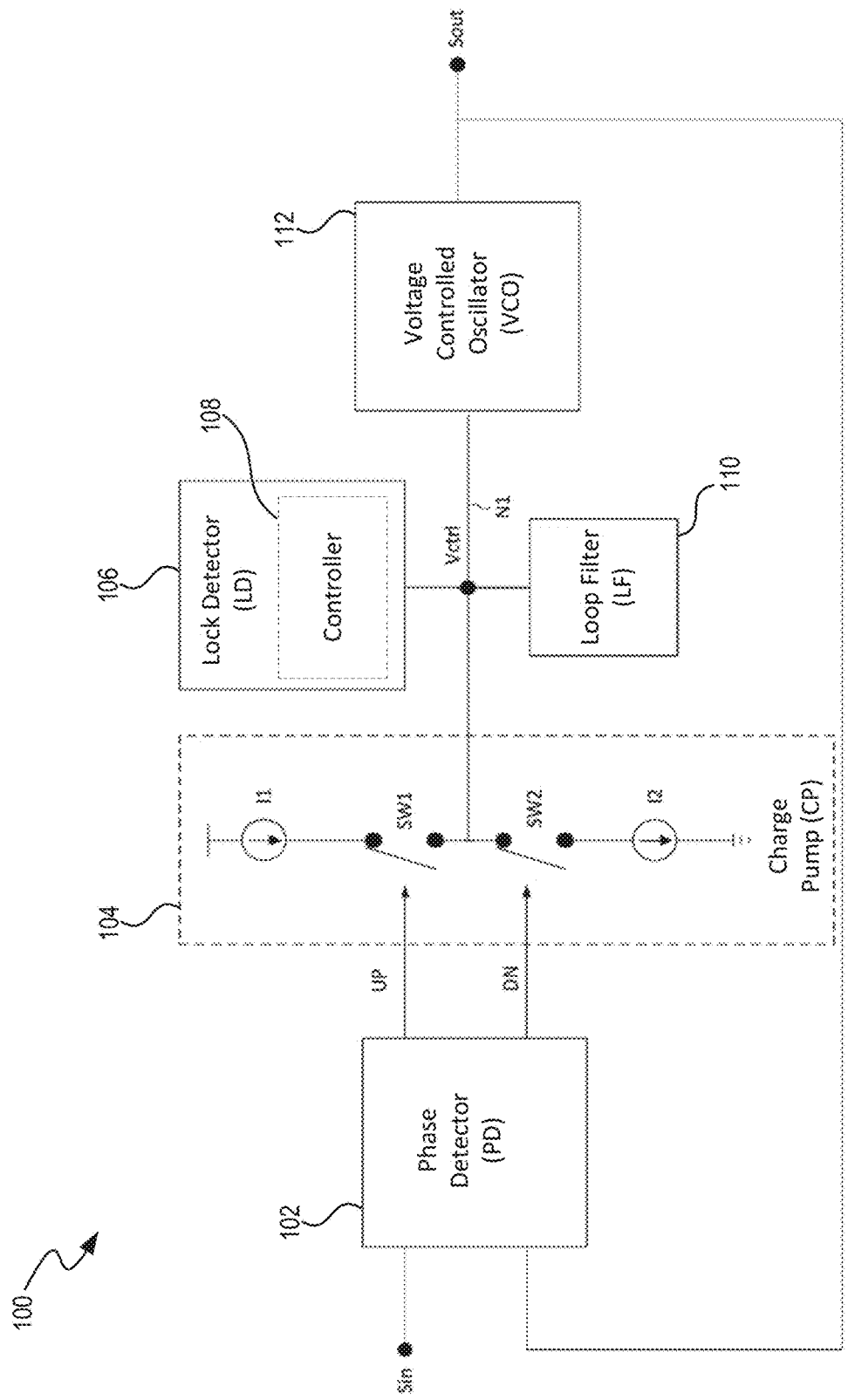
FIG. 1 is a block diagram of a representative clock and data recovery (CDR) circuit with an asymmetrical charge pump.

In data communication, such as serial communication of digital data, clock and data recovery is necessary when data is transmitted without a reference clock signal. If a receiver does not have a reference clock signal, the receiver may over or under sample the data, and thus, can experience bit errors. Although over and/or under sampling is an issue, there is still a push towards sending data without reference clock signals. One reason for this is because a signal has limited space (e.g., bandwidth) in which to carry data. Due to the limited space, it is necessary, in view of the need to communicate at higher rates with more data, to reduce unnecessary data being transmitted on the signal. The unnecessary data can be overhead data such as the reference clock signal. In other words, the transmitted signal should not be inundated with overhead data but optimized to carry as much necessary data as possible.

Thus, clock and data recovery (CDR) techniques are increasingly important and have become necessary components in many devices. Clock recovery is the process of extracting timing information (e.g., the reference clock signal) from the data stream so as to allow the receiving circuit to decode the transmitted data. Clock recovery is common in systems that communicate over, for example, wires, optical fibers, or wirelessly.

When data is sent without a corresponding reference clock, a receiver circuit can perform clock and data recovery (CDR). For example, a receiver circuit can include a phase-locked loop (PLL) circuit to help with recovering the reference clock. The PLL circuit can generate the clock by approximating the frequency at which the data is being received and aligning the phase of the data stream with the output data stream. Other examples of CDR include using a delay-locked loop (DLL) and/or oversampling of the data stream. A DLL is similar to a PLL except that the DLL does not include a voltage-controlled oscillator. Instead, a DLL includes a delay line. A DLL is mainly composed of a delay chain of many delay gates connected output-to-input. The input to the DLL is connected to the internal clock. The internal clock is then negatively delayed due to the chain of delay gates between the input and the internal clock.

As such, at least one variation of a CDR circuit is a crucial component of many devices because most devices receive data through one or more communication systems (e.g., optical communication system, Ethernet or wireless). For instance, a laptop can utilize a CDR circuit to process data received via the Ethernet connection. The laptop can be receiving data for displaying a video, and the data can be streamed through the Ethernet connection. If the data is transmitted without a reference signal, the laptop may over or under sample the stream of data and thus, the video may not be presented correctly (e.g., missing frames or lower resolution). To avoid such issues, the laptop can utilize a CDR circuit to approximate the frequency and phase of the input signal from the Ethernet connection. The laptop can then sample the data stream at the correct rate in order the minimize bit errors.

As briefly mentioned above, traditional CDR techniques include frequency detectors. The frequency detectors operate at high frequency rates because of the need to sample the received signal at a high rate to better approximate the frequency. However, the high frequency results in high power consumption and a heavier load on the circuit. For example, in the laptop example above, a manufacturer of the laptop would likely need to minimize power consumption to increase stand-alone usage time. In other words, in many devices that operate on rechargeable batteries, power consumption is a principal concern.

Another issue is the heavy load that the frequency detector places on the circuit. Given that the frequency detector operates at a high frequency, it obtains data that needs to be, at least in the interim, saved to determine the frequency of the signal. The data needs to be saved to local memory on, for example, a CDR printed circuit board (PCB). However, space on PCBs is also limited, and thus, valuable. The heavy data consumption is, then, a burden on the PCB that needs to be addressed.

Accordingly, the present disclosure is directed toward a CDR circuit with components, such as a charge pump with asymmetrical current sources, to lock a frequency of a signal. Notably, some embodiments do not require a frequency detector or a reference clock (e.g., a crystal oscillator) to achieve CDR functionalities.

In the following description, the example of a CDR circuit is used, for illustrative purposes only, to explain various techniques that can be implemented using an asymmetrical charge pump. For example, even though one or more figures introduced in connection with the techniques illustrate a particular CDR circuit configuration, in other embodiments, the techniques are applicable in a similar manner to other CDR circuits configured in a different manner. In another example, even though the techniques can be applied to CDR circuits with asymmetrical charge pumps, other electrical components can be added or removed to retain functionality.

In the following, numerous specific details are set forth to provide a thorough understanding of the presently disclosure. In other embodiments, the techniques introduced here can be practiced without these specific details. In other instances, well-known features, such as design and fabrication techniques for known circuits, are not described in detail in order to avoid unnecessarily obscuring the present disclosure. References in this description to "an embodiment," "one embodiment, "an example", or the like, mean that a particular feature, structure, material, or characteristic being described is included in at least one embodiment of the present disclosure. Thus, the appearances of such phrases in this specification do not necessarily all refer to the same embodiment. On the other hand, such references are not necessarily mutually exclusive either. Furthermore, the particular features, structures, materials, or characteristics can be combined in any suitable manner in one or more embodiments. Also, it is to be understood that the various embodiments shown in the figures are merely illustrative representations and are not necessarily drawn to scale.

Several details describing layouts or processes that are well-known and often associated with CDR circuitry and corresponding electrical components, but that can unnecessarily obscure some significant aspects of the disclosed techniques, are not set forth in the following description for purposes of clarity. Moreover, although the following disclosure sets forth several embodiments of different aspects of the present disclosure, several other embodiments can have different configurations or different components than those described in this section. Accordingly, the introduced techniques can have other embodiments with additional elements or without several of the elements described below.

Overview of a CDR circuit

FIG. 1 is a block diagram of a representative CDR circuit 100. CDR circuit 100 includes phase detector (PD) 102, charge pump (CP) 104, lock detector (LD) 106, controller 108, loop filter (LF) 110, and voltage-controlled oscillator (VCO) 112, and other components and nodes. PD 102 compares the phase difference between the two input signals, Sin and Sout, and generates corresponding charge pump control signals, UP and DN. The generated signals, depicted as UP and DN in FIG. 1, are input into the CP 104. In response to receiving the UP or DN input signals from the PD 102, CP 104 uses a pull-up current source I1 or a pull-down current source I2 to increase or decrease, respectively, the voltage at the output of CP 104 (i.e., the voltage at node N1, which is depicted as Vctrl in FIG. 1). This oscillator control signal Vctrl in turn controls the VCO 112. The VCO 112 is operable to generate an output signal Sout at different frequencies in response to the different voltage level of the Vctrl.

In this embodiment, the output signal Sout is directly input to the PD 102. In some other embodiments, a divide-by-N frequency divider can be added between the output of VCO 112 and PD 102 such that the frequency of the output signal Sout is N times of the frequency of the input signal Sin. In one embodiment, PD 102 can be a bang-bang phase detector.

Generally speaking, a CP's function is to drive its output voltages (e.g., Vctrl in FIG. 1) up or down. This output voltage can be increased and decreased by way of utilizing different current sources included in the CP. In one implementation, the CP can include one current source connected to the positive terminal of a voltage source and another current source connected to the negative terminal of the voltage source. The current source connected to the positive terminal can be called the "positive current source" and the current connected to the negative terminal can be called the "negative current source." For the example CDR circuit 100 shown in FIG. 1, the CP 104 includes two current sources I1 and I2. Current sources I1 and I2 can be connected in series, and controlled by current source control switch 1 (SW1) and control switch 2 (SW2). Current source I1 can be a current source designed to supply positive current through SW1 to pull up the Vctrl voltage towards a first voltage (e.g., a voltage source supplying a VDD voltage), and current source I2 can be a current source designed to connected to the ground, and thus, supply negative current through SW2 to pull down the Vctrl voltage towards a second voltage (e.g., ground or a voltage source supplying a VSS voltage).

In some embodiments, current sources I1 and I2 can supply predetermined amounts of current. For example, the CP 104 can be designed with a current generated by the current source I1 being greater than a current generated by the current source I2. In this case, Vctrl voltage will increase from its starting voltage value towards the first voltage. In some embodiments, current sources I1 and I2 can be adjustable current sources. For example, based on the circumstances, the current generated by current source I1 or the current generated by current source I2 can be dynamically increased or decreased. This can be useful if, for example, Vctrl voltage is increasing or decreasing at a rate that is too slow. To remedy the rate, either current source I1 or I2 can be adjusted to increase the rate. For instance, to increase the rate at which Vctrl voltage increases, current source I1 can be increased or current source I2 can be decreased. As such, current sources I1 and I2 can be adjusted to control Vctrl voltage level. Alternatively, other configurations are also possible. For instance, multiple current sources can be combined to form each of the current sources I1 and I2. For example, current source I1 can include two or more current sources connected in parallel supply the positive current. Similarly, current source I2 can include multiple current sources connected in parallel. In certain embodiments, additional current sources can be added to current source I1 and/or current source I2 to change the current being supplied to node N1. For example, an additional current source can be connected in parallel to current source I1 to increase the positive current being supplied to node N1. Alternatively or additionally, other electrical components can be added to adjust the current being supplied. For instance, resistors can be connected (e.g., in parallel in series) to the current source I1 and/or current source I2 to change the current flowing to node N1. In one or more embodiments, the current sources I1 and I2's current draw can be configured through one or more corresponding registers.

Irrespective of which current source is positive or negative, a CP may have a built-in (e.g., natural) bias to drive a corresponding voltage (e.g., Vctrl) up or down. The built-in bias can occur due to, for example, discrepancies during manufacturing. However, conventionally it is desirable to have a symmetrical configuration, in terms of the driving force, for the two current sources, such that both current sources provide almost equivalent current drive. Having a symmetrical design may provide for symmetrical performance in pull-up and pull-down, which is generally desirable. It is noted here that the terms "symmetrical," "symmetry," "asymmetrical," and "asymmetry," as they applied to current source design choices in charge pumps, refer to the current sources' driving forces (which can be reflected in the amount of current draw, e.g., in Ampere). These terms do not refer to the physical size of the current sources. For example, it is known that different PMOS and NMOS transistors may have different driving forces due to mobility differences in electrons and electric holes, and it is typical to have mismatch designs in pull-up and pull-down current sources such that the pull-up driving force and pull-down driving force can achieve or to be as close to symmetry as possible.

However, in the present disclosure, techniques are introduced such that the CP's pull-up power and pull-down power are intentionally designed to be asymmetrical, so as to cause either a pull-up or pull-down tendency. The deliberated designed tendencies can result in Vctrl being naturally driven up or down. In various embodiments disclosed here, this designed tendency to pull up or pull down the Vctrl, along with the control circuitry and implementation techniques introduced further below, the CDR circuit here can sweep a range of frequencies until a lock occurs. For example, as depicted in FIG. 1, current source I1 can be a positive current source (e.g., connected to the positive terminal of the voltage supply) and I2 can be negative current source (e.g., connected to the negative terminal of the voltage supply). In a "pull-up tendency" configuration, current source I1's driving power is designed to be greater (e.g., by 20% or more or any other suitable parameter) than current source I2, where the voltage level at Vctrl will gradually increase during the locking process of the CDR circuit 100. In an alternative configuration, i.e., "pull-down tendency," current source I2 can be designed to have a greater (e.g., by 20% or more or any other suitable parameters) current driving force than current source I1. In this alternative case, the voltage level at Vctrl will gradually be drained to the ground.

In some embodiments, the current sources can be designed to control the rate at which the tendency affects the corresponding voltage (e.g., Vctrl). For example, the two current sources I1 and I2 can intentionally be made to have asymmetry of 20% or more. Such asymmetry can cause an increase or decrease in the corresponding voltage (e.g., Vctrl). In FIG. 1, for example, in a pull-up tendency, current source I1 can provide positive current 20% or more greater than the negative current of current source I2. In a pull-down tendency, current source I2 can provide negative current 20% or more greater than the positive current of current source I1. In both cases, due to the intentionally designed difference in the current supplied by the current sources, the voltage of Vctrl can increase or decrease. Thus, the CP in accordance with the present disclosure includes intentionally designed asymmetry between the two current sources to cause a pull-up or pull-down tendency.

Another component that is coupled to Vctrl and node N1 is the LD 106. LD 106 is, generally, designed to detect a lock status of the CDR circuit 100, e.g., when the phase and frequency of the Sout signal matches (e.g., the same, or within a threshold) the phase and frequency of the Sin signal. According to one or more of the present embodiments, LD 106 can also determine whether a lock status is in a suitable VCO condition based on a comparison between the Vctrl and a predetermined VCO reference voltage, i.e., a threshold voltage. In some implementations, that threshold voltage is ½ the supply voltage. In some examples, LD 106 can include a comparator circuit which compares the voltage of Vctrl to a predetermined, threshold (or reference) voltage.

Controller 108 can control the lock process of the CDR circuit 100, for example, by using those techniques described below in relation to FIGS. 2-5. Although depicted in FIG. 1 as a part of the LD 106, in actual implementation the controller 108 may or may not be in LD 106, as it may be implemented as a separate circuit or be combined with other suitable circuits. Also, in implementing various control functions described here, controller 108 is coupled to one or more suitable circuits, e.g., LD 106, VCO 112, and can either directly or indirectly control the voltage level of Vctrl (described in further detail below). For simplicity, these signal lines of the controller 108 are not depicted in FIG. 1.

Specifically, depending on the embodiments, controller 108 can monitor the lock status, determine whether the lock is at a suitable Vctrl range, switch VCO 112 to different frequency bands, control the voltage of Vctrl in effecting the frequency band sweeping (as discussed further in relation to, e.g., FIGS. 3, 5, and 6), as well as control the overall status (e.g., setting all said parameters during initialization of the CDR circuit 100 and in a reset situation).

VCO 112 has an oscillation frequency output that is dependent on its input control's voltage. Specifically, as shown in FIG. 1, VCO 112 receives the Vctrl input and generates an output clock signal based on Vctrl. The output clock signal then is fed back to PD 102. According to the present embodiments, the VCO 112 can also be controlled by controller 108 to control the frequency band in which the VCO 112 operates. For example, initially, the LD 106 can determine whether the CDR circuit 100 has settled, which in some embodiments can be deemed to occur when the frequency and phase of the Sout signal matches the frequency and phase of the Sin signal. Note, however, that, depending on the field application, some embodiments of the CDR circuit may include a frequency divider, and in which case, the frequency of Sout may be a multiple (or fraction) of Sin. In addition, or as an alternative, the CDR circuit can be deemed as settled when the frequency and/or phase of the Sout signal is sufficiently similar to (e.g., within an acceptable range of) those of the Sin signal.

When the CDR circuit 100 settles, the controller 108 can determine whether Vctrl has a voltage within a desired range (e.g., depending on the configuration, either greater than or less than the threshold voltage) such that the operation of VCO 112 is relatively stable (e.g., having a higher frequency variation tolerance). The desired voltage range can depend on whether the CDR circuit 100 is operating in a pull-up or pull-down tendency and can be relative to the threshold voltage, as further described below.

If the controller 108 determines that the voltage is within the desired range, the controller 108 can indicate a lock, and signal the VCO 112 to not change the frequency band. On the other hand, if the controller 108 determines that the voltage is not within the desired range, the controller can reset Vctrl to the initial value (e.g., supply voltage or ground voltage) and signal the VCO 112 to change the frequency band to the next one. Accordingly, the controller 108 and VCO 112 can interact to continue to switch frequency bands, until a lock occurs and the Vctrl is operated within the desired range. If the last frequency band is reached, the VCO 112 can indicate as such to the controller 108. The controller 108 can then reset Vctrl and signal VCO 112 to operate within the frequency of the initial frequency band. Through the series of events above, the VCO 112 can set the frequency of Sout to be within certain frequency bands of the available frequency range until the CDR circuit 100 settles and Vctrl is within the desired range.

For instance, in a pull-up tendency configuration, Vctrl can increase and the VCO can sweep through frequencies across available frequency bands (e.g., one-by-one) as described above. Once the LD 106 detects that the CDR has settled, the controller 108 can determine whether Vctrl is within the desired range. Assuming for this example that Vctrl is not within the desired range, the controller 108 can reset the voltage to, for example, the ground voltage, and signal to VCO 112 to switch to the next highest frequency band. The controller 108 and VCO 112 interact in this manner until a lock occurs within the desired range or until the VCO 112 reaches the last frequency band. In the pull up tendency configuration, the last frequency band can be the highest frequency of the available range. If the VCO 112 reaches the highest band, the controller 108 can signal the VCO 112 to reset to the band at the bottom of the available range. The LD 106, controller 108, and VCO 112 can interact in this manner to determine whether the CDR circuit has settled (e.g., Sout signal frequency and phase the same as Sin signal) and whether, when the CDR is settled, the VCO control input Vctrl is within the desired range (so as to constitute a "lock" within the meaning of this disclosure).

Lastly, the CDR circuit 100, as shown in FIG. 1, also includes LF 110. Notably, although may be beneficial, LF 110 may not be a necessary component to practice the techniques disclosed here. LF 110 can include a filter circuit, e.g., a resistor in series with a capacitor, which is configured to filter and stabilize the Vctrl signal (e.g., smoothing of voltage through moving average over time).

The CDR circuit 100 illustrated in FIG. 1 uses analog circuits to implement CP 104, LF110 and VCO 112. In some other embodiments, CP 104, LF110 and VCO 112 can be implemented by digital circuits such that CDR circuit 100 forms an all-digital CDR.

Pull-Down Tendency

The following description is explained with simultaneous reference to the CDR circuit 100 in FIG. 1.

Figure 2:
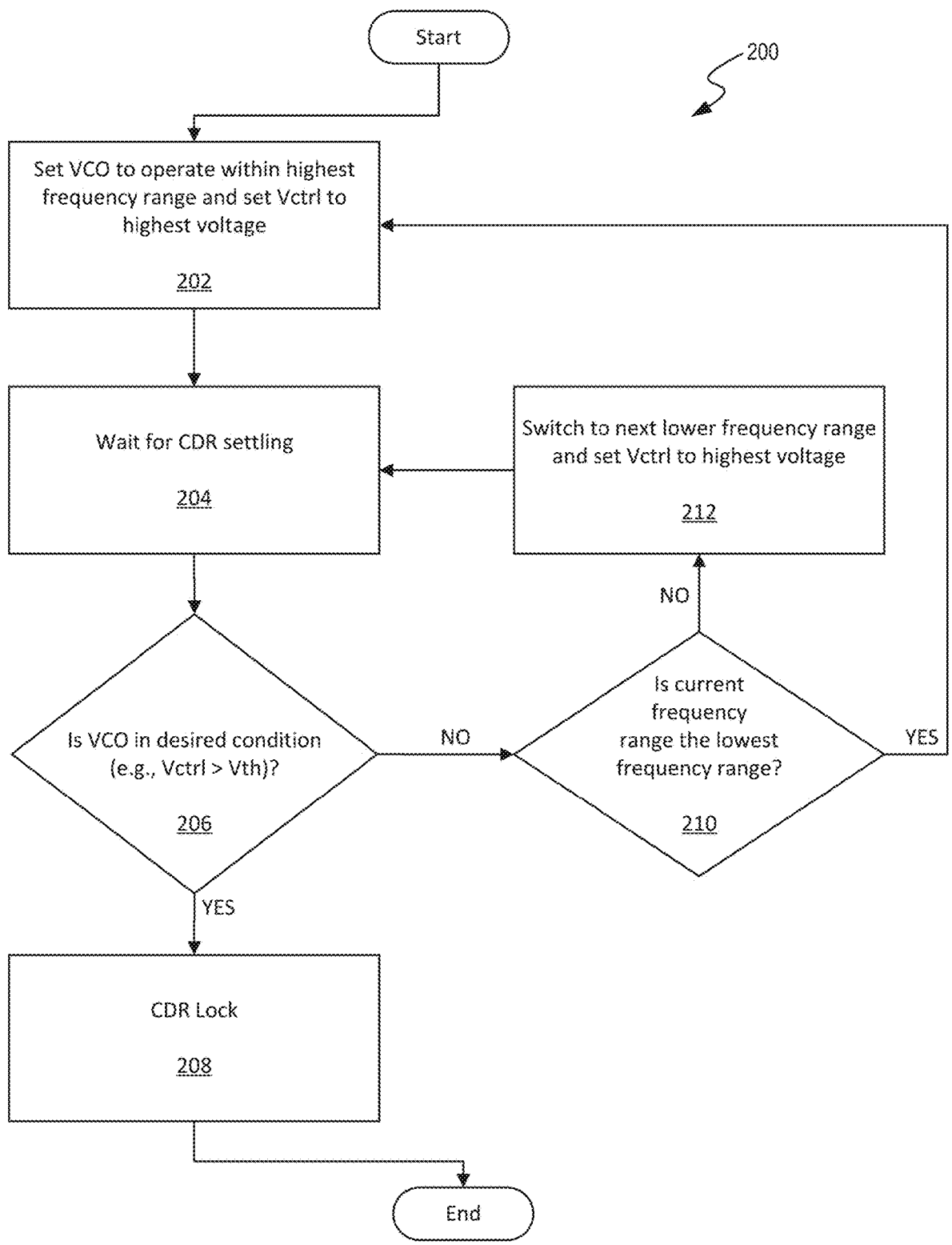
FIG. 2 is a diagram of an example CDR control flow for a CDR circuit configured with a pull-down tendency.

FIG. 2 is a flow chart diagram 200 of an example CDR control method designed to have pull-down tendency, which can occur when the negative current is intentionally configured to be greater (e.g., 20% or more) than the positive current. In other words, in this tendency, Vctrl is being pulled down towards ground due to I2 being intentionally configured to be greater than current source I1. At block 202, the CDR circuit 100 can set VCO 112 to operate within the highest frequency range and set Vctrl to the highest voltage (e.g., VDD). The entire frequency range can depend on the capabilities of the CDR circuit 100. For example, the entire frequency range can be segmented to cover 4 GHz of range. Each frequency range can include a segment of the entire frequency range such that there are a predetermined number of ranges. For instance, there can be 64 partially-overlapping frequency ranges (bands) that cover the 4 GHz of range, where each frequency range covers 100 MHz. The voltage, for example, can vary between a minimum equivalent to the ground voltage and a maximum equivalent to the supply voltage. Thus, in this example, at block 202, the VCO can be set to operate within the highest frequency band of the 4 GHz of range and the voltage can be set to the supply voltage.

At block 204, the CDR circuit 100 can wait for the CDR to settle. In this context, settle can be mean that the frequency of the output signal Sout is substantially near (e.g., within a frequency threshold that can be determined by the LD 106) the frequency of the input data signal Sin, and that the phase of the output signal Sout is substantially near (e.g., within a phase threshold that can be determined by the LD 106) the phase of the input data signal Sin. The frequency of the output signal Sout generated by VCO 112 is controlled based on Vctrl. Vctrl, as mentioned above, can be changed based on the designed tendency caused by the currents provided by current sources I1 and I2. Here, in a pull-down tendency, current source I2 is intentionally configured to be greater than current source I1 and thus, Vctrl is pulled down towards ground. By doing so, the frequency of output signal Sout decreases until the frequency settles to being substantially near the frequency of the input signal Sin.

Once the frequency and phase of Sout are settled, at block 206, LD 106 can determine whether VCO 112 is operating in a desired condition. In some implementations, the VCO 112 is determined to be operating in a desired condition when Vctrl is within a desired range. As one example, the desired range during a pull down tendency can be, for example, greater than a threshold voltage. Thus, the LD 106 can compare the voltage of Vctrl with a predetermined threshold voltage (e.g., Vth). In some embodiments, Vth can be predetermined value such as, for example, half the supply voltage or another value. If the Vctrl is greater than Vth, the LD 106 can determine that a lock has occurred, at block 208. As another example, the LD 106 can compare the voltage of Vctrl with a predetermined threshold voltage to determine a voltage difference. If the voltage difference is within an acceptable value, the LD 106 can determine that a lock has occurred, at block 208.

If, however, LD 106 determines that the VCO 112 is not operating in a desired condition, the controller 108 can determine whether the current band is the lowest band in the frequency range, at block 210. For example, LD 106 may determine that the VCO is not operating in a desired condition if Vctrl is less than Vth when the CDR circuit 100 settles. In response, the controller 108 can determine whether the VCO 112 is operating in the last band. Then, in the instances where there is a next band available, the controller 108 can signal the VCO 112 to switch to the next band. On the other hand, if the VCO 112 is already operating within the last band, the controller 108 can reset the CDR circuit 100 to initial stage at block 202. If the current band is not the lowest band, then the controller 108 can switch to the next lowest frequency band and can set Vctrl to the highest voltage (e.g., supply voltage). After this stage, the process can return to block 204.

Figure 3:
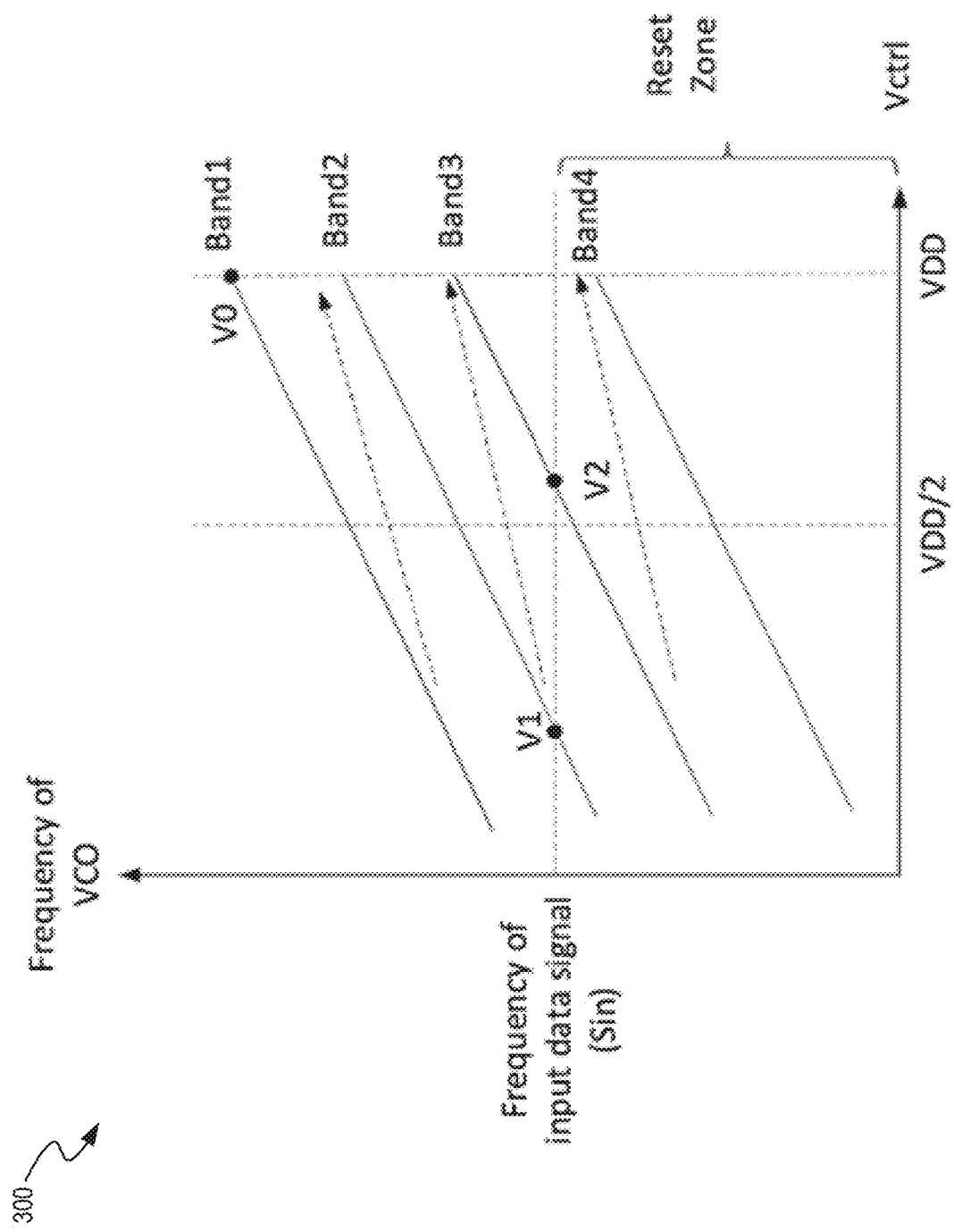
FIG. 3 is a graph illustrating an example manner that the frequency bands can be swept in a CDR circuit configured with a pull-down tendency.

FIG. 3 depicts the flow chart diagram described FIG. 2 in a graphical form. The graph 300 depicts the relation between the frequency ranges in a pull-down tendency. The graph 300 shows an x-axis representing the voltage of Vctrl and a y-axis representing the frequency of a voltage-controlled oscillator (e.g., VCO 112 in FIG. 1). As mentioned in conjunction with block 202 in FIG. 2, V0 is the starting voltage. V0 is set to the highest voltage. Here, the highest voltage is VDD (e.g., the supply voltage), however, other voltages are also possible (e.g., a fraction of the supply voltage). Further, the frequency of VCO can be set to operate in the highest band, Band 1.

As Vctrl is pulled down towards ground, the voltage decreases. In some embodiments, the rate that the voltage decreases can be directly related to the current draw difference between the current sources I1 and I2. Since the CP can be intentionally designed to have at least a 20% difference between the two current sources, the rate of the voltage decreases can be indirectly controlled due to the at least 20% difference. For example, as mentioned above and as shown in FIG. 3, the voltage decrease is a stable descent due to the intentionally designed difference in the current sources, rather than a volatile one that may deteriorate the CDR circuit. For instance, the CP can be designed to have a 25% current draw difference between the current sources. Note however, as mentioned above, manufacturing error can result a built-in bias that may alter the designed 25% difference, but such built-in bias is typically small compared to the designed difference. Accordingly, the designed 25% difference, along with any built-in bias, can result in a corresponding and stable pulling up or pulling down of Vctrl.

As the voltage on Vctrl decreases, the output frequency Sout of VCO also decreases within Band 1. Once the voltage decreases to a minimum value (e.g., in Band 1), the controller (e.g., controller 108 in FIG. 1) can reset the Vctrl to VDD and signal the VCO to operate with the frequency of the next band, Band 2. Again, the voltage of Vctrl decreases and the frequency of VCO also decreases within Band 2. In Band 2, as depicted in FIG. 3, the frequency settles at V1.

However, at V1, Vctrl is less than a predetermined threshold value. In some embodiments, as in FIG. 3, the predetermined threshold value can be half the supply voltage, VDD. Since the Vctrl is less than half of VDD, the controller resets Vctrl to VDD and signal the VCO to operate within Band 3. In Band 3, the frequency settles at V2. At V2, Vctrl is greater than half of VDD. Thus, the LD can determine that a lock has occurred. In some embodiments, if the lock does not occur, the controller can continue to reset Vctrl and signal the VCO to proceed through each band of the frequency range. Once the VCO reaches the lowest band, the controller can reset to operate within the highest band (e.g., Band 1). In this manner, until a lock occurs, the controller and VCO can interact to linearly sweep through each band of the frequency range.

Further, once the frequency enters the reset zone, it is unlikely that the frequency will settle. This is because the bands in the reset zone operate below the frequency of the input signal. Thus, the frequency cannot settle in these bands. Nevertheless, in some embodiments, the controller can sweep through the remaining bands prior to resetting to Band 1. For example, in a pull-down tendency with 64 bands, the controller can sweep through all 64 bands until a lock occurs. If a lock does not occur, the controller can reset to operate with band 1 and sweep through all 64 bands again.

Pull-Up Tendency

Figure 4:
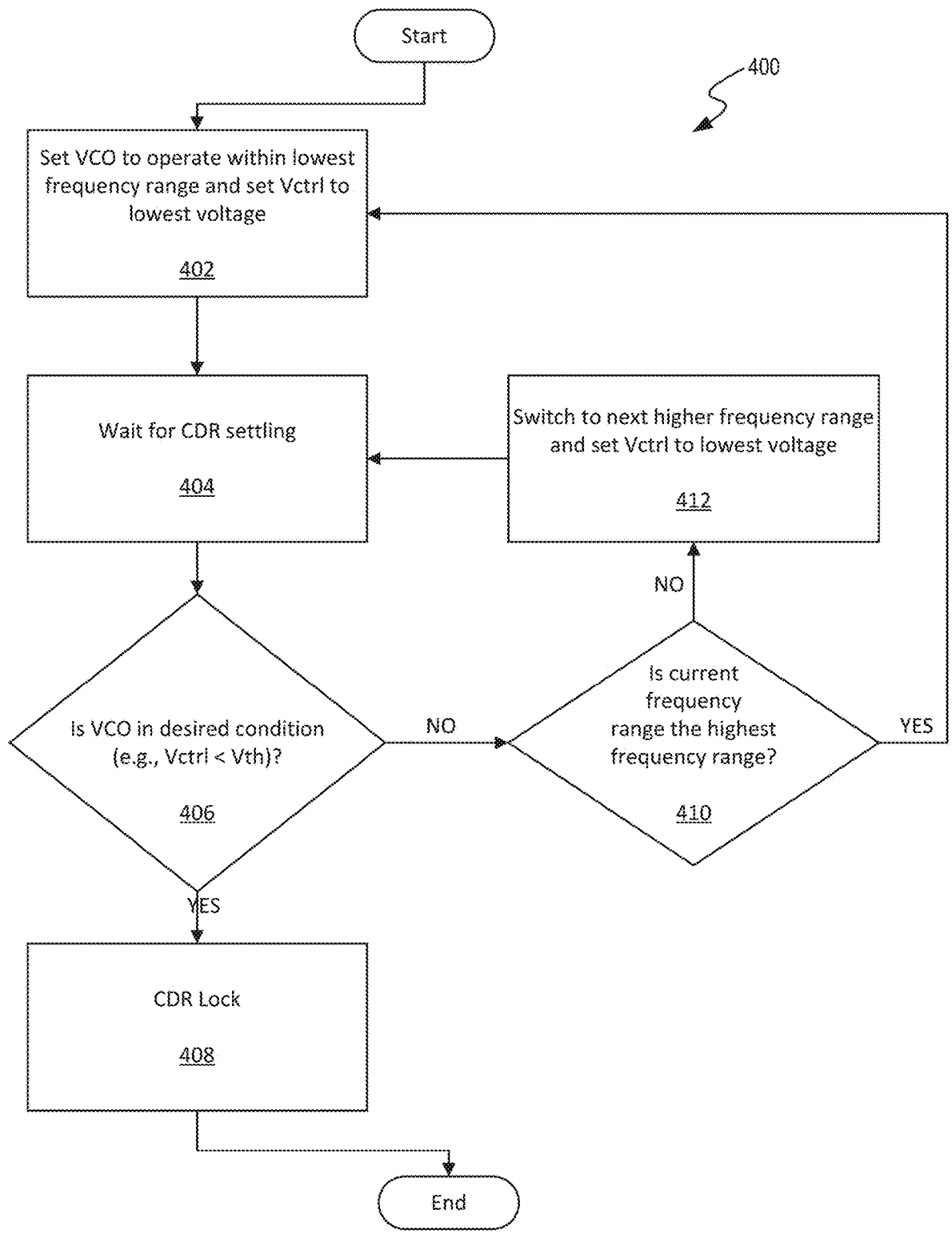
FIG. 4 is a diagram of an example CDR control flow for a CDR circuit configured with a pull-up tendency.

FIG. 4 is a diagram 400 of an example CDR control flow in a pull up tendency. With simultaneous reference to the CDR circuit 100 in FIG. 1, FIG. 4 is now described. Further, the techniques described below can also apply the techniques described in the disclosure under the sections above (e.g., the "Pull Down Tendency" section). For brevity purposes, all the techniques described in previous sections are not repeated below; however, the techniques can apply to the pull up tendency in the same or similar fashion. Diagram 400 depicts the control states during a pull up tendency, which is when positive current is intentionally made to be greater (e.g., at least 20% greater) than the negative current. In this case, Vctrl is driven upward due to the influx of positive current from current source I1. Due to the increase in current source I1, the frequency from VCO and in turn, the frequency of the output signal (Sout), also increases.

In FIG. 4, at block 402, the controller signals the VCO to operate within the lowest frequency range and sets Vctrl to the lowest voltage. The controller does this because, in a pull up tendency, the frequency of the VCO, along with the VCO control voltage Vctrl, increases over time. Thus, in order to sweep the entire available frequency, the VCO starts at the lowest frequency band and the controller sets Vctrl at the lowest voltage value. Block 404 is similar to block 204 in FIG. 2, where the controller circuit waits for the CDR to settle (e.g., frequency and phase of Sout signal equal those of Sin signal). At block 406, in a pull-up tendency, the controller can check whether VCO is operating in a desired condition (e.g., Vctrl is below a threshold voltage, Vth). If the Vctrl is less than the threshold voltage, the LD can determine that a lock has occurred. If not, the controller can determine whether the current frequency band is the highest band. If it is the highest band, then the controller can reset to the conditions in block 402. If it's not highest band, the controller can signal the VCO to switch to the next highest band and set Vctrl to the lowest range.

Figure 5:
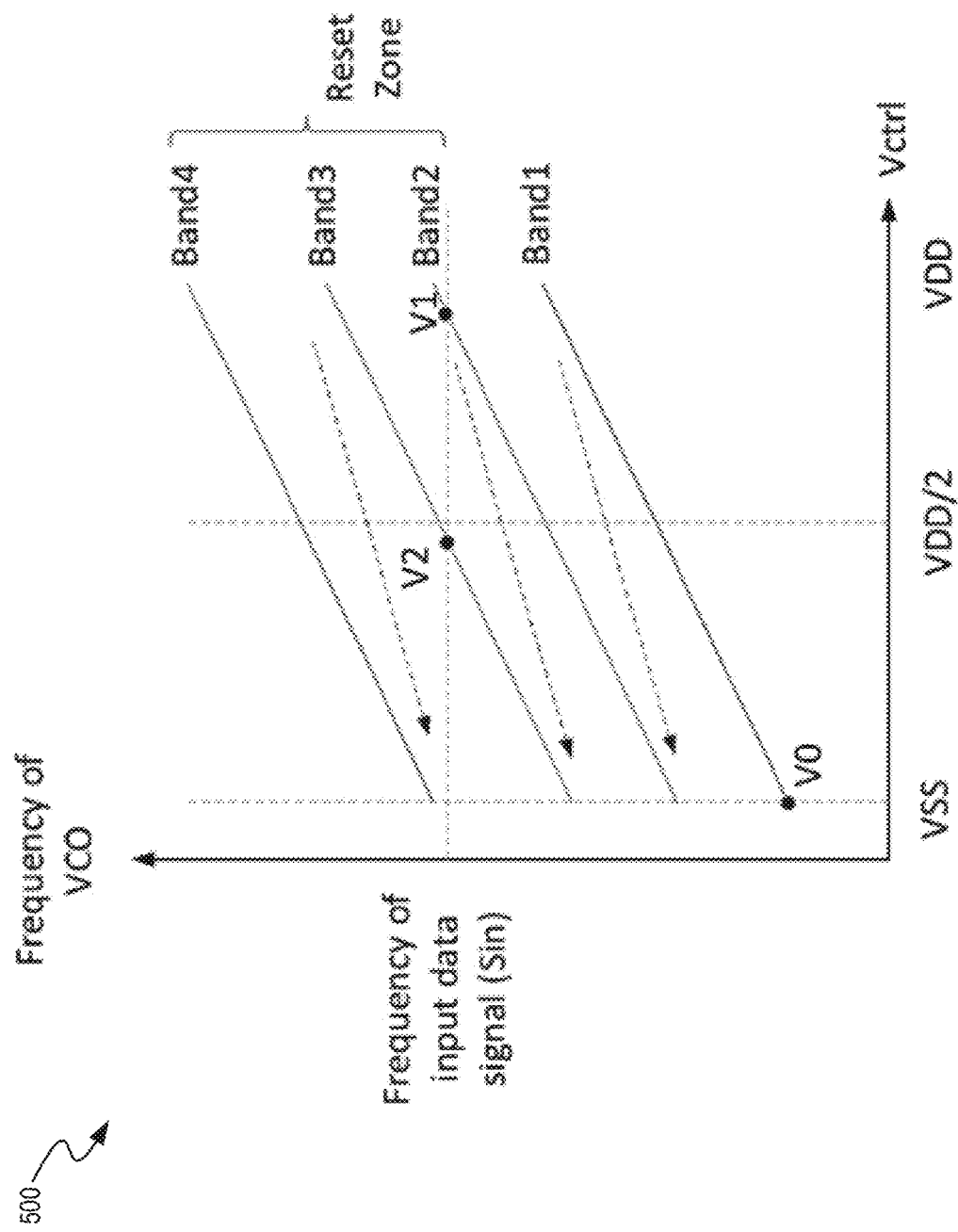
FIG. 5 is graph illustrating an example manner that the frequency bands can be swept in a CDR circuit configured with a pull-up tendency.

FIG. 5 depicts a graphical representation of the pull-up tendency. In graph 500, the voltage of Vctrl and the frequency of the VCO increase within each frequency band because of the pull up tendency. Initially, the controller sets Vctrl at V0. In some embodiments, V0 is equivalent to ground voltage, VSS. However, other minimum values can be used such as a fraction of the supply voltage, VDD. The threshold voltage, Vth, can be set to half the supply voltage, VDD.

As more positive current is supplied, Vctrl increases, which can cause the frequency of VCO to also increase. Once the upper limit of Band 1 is reached, the controller can signal the VCO to change the conditions to operate within higher bands (e.g., Band 2) until the frequency settles. In FIG. 5, the frequency initially settles at V1. However, at V1, Vctrl is higher than the threshold voltage, which is half of the supply voltage, VDD. In some cases, a higher band can include a settling frequency and a Vctrl voltage that is below and closer to the threshold voltage. Thus, the controller switches to Band 3, where the frequency settles at V2 because V2 is below the threshold voltage.

If, however, the frequency does not settle at a higher band, the controller and VCO can interact to sweep through the remaining bands and when the Sout frequency reaches the last band, the controller can signal the VCO to reset to operate within Band 1. As depicted in FIG. 5, the reset zone can be any of the bands that operate, at least partially, above the frequency of the input signal. This is because once the frequency increases above the frequency of the input signal, the frequency cannot settle.

Figure 6:
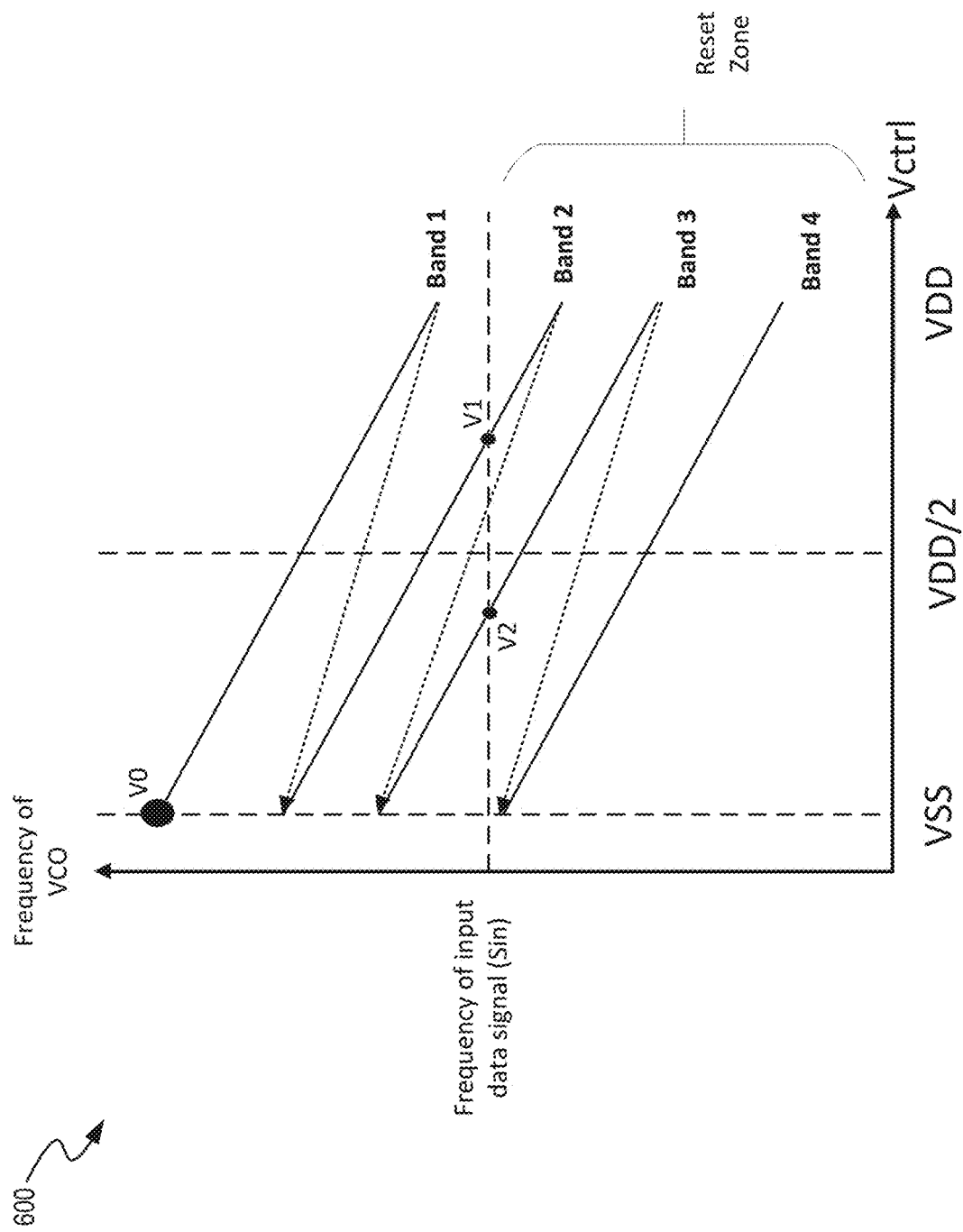
FIG. 6 is a graph illustrating another example manner that the frequency bands can be swept in a CDR circuit with an alternative configuration of the pull-up tendency, where the VCO's frequency is inversely related to its input control voltage (i.e., the oscillator control signal).

FIG. 6 is a graph 600 illustrating another example manner that the frequency bands can be swept in a CDR circuit with an alternative configuration of the pull-up tendency. As an alternative to the configuration in FIG. 5, in FIG. 6, the VCO's frequency is inversely related to the voltage of its control input Vctrl. The lowest voltage for Vctrl can be, in some embodiments, the ground voltage, VSS, or a fraction of the supply voltage, VDD. In FIG. 6, because of the inverse correlation in the VCO transfer function, the controller and VCO interact to sweep the frequency bands by starting at the highest frequency range, Band 1, and the lowest voltage, VSS.

In Band 1, the frequency does not settle, and thus, the controller signals the VCO to jump to next lower frequency band, Band 2. In Band 2, the frequency settles at V1. However, V1 is larger than the threshold voltage, e.g., half of VDD. In some embodiments, when the difference is higher than the permitted threshold, the controller signals the VCO to jump to the next frequency band even though the CDR circuit is able to settle. In FIG. 6, V1 is higher than the predetermined threshold, which in this case is half of the VDD, and thus the VCO jumps to the next frequency band.

Depending on the embodiment, the controller may be configured to perform different checks to determine whether to jump to the next frequency band, or whether the VCO is already operating in a desired condition, after the frequency has settled. For example, one embodiment provides that a check being whether Vctrl is lower than the threshold voltage (e.g., block 406 in FIG. 4). In an alternative embodiment, the check can be whether the difference between the settling voltage and the threshold voltage is below a predetermined threshold. If the check passes as true, then the LD can determine that a lock has occurred. However, if the check fails, the VCO can jump to the next frequency band.

In FIG. 6, for example, the check fails for V1 because V1 is higher than the threshold voltage.

In Band 3, the CDR circuit settles at V2, where the controller can perform again the check (e.g., block 406) to determine whether the VCO is in a desired condition. If the controller determines that the VCO is not operating in a desired condition, then the controller can jump to Band 4 and proceed through the remaining bands. Once it reaches the last band, the controller can reset to Band 1 and begin the process again. However, if the CDR circuit settles at V2, such as depicted in FIG. 6, and if V2 is within the desired threshold range (e.g., here, lower than VDD/2), the controller determines that the CDR circuit has locked.

Alternatives to Linear Sweeping of Frequency Bands

Although the description above primarily describes linearly sweeping through each frequency band until a lock is determined or resetting at the last band and linearly sweeping again, other techniques can also be applied. In general, the CDR circuit can apply any suitable search algorithm to determine whether a lock has occurred. For example, the bands can be grouped. The grouping can be based on, for example, the amount of frequency overlap between the bands or proximity to each other. For example, the first two bands can be grouped into one group, the next two bands can be grouped into another group, and so on. In this case, the controller can jump to only one band within each group. If the LD detects a near lock in one of the bands within a group, the controller can jump to the other band within the same group. By narrowing the possible bands that a lock can occur within, the locking time may be shortened.

Another alternative to linear sweeping is a targeted approach. For example, the controller can receive through an intelligence input a possible range for the input signal's frequency, and that possible range is narrower than the entire available range of the CDR circuit. Then, the controller can configure the CDR circuit so that it starts by operating within the bands that overlap with the frequency of the input data signal. For example, if a frequency range has 64 frequency bands, but only 5 of the bands overlap the frequency of the input signal based on the intelligence input, the controller can sweep only those 5 bands. In some embodiments, the controller can determine which bands overlap with the frequency of the signal based on the starting frequency and ending frequency of each band. For instance, if the starting frequency is above the frequency of the input signal and the ending frequency is below the frequency of the input signal, the controller can determine that this band does overlap with the frequency of the input signal.

Yet another alternative can be performing a partial linear sweep of the frequency bands until a starting frequency value of a subsequent band is above or below the frequency of the input signal. In the pull up tendency, if the subsequent band has a starting frequency value above the frequency of the input signal, the controller can reset to the starting band (e.g., Band 1). In the pull-down tendency, in the subsequent band has a starting frequency below the frequency of the input signal, the controller can again reset to the starting band.

In some embodiments, rather than resetting to the starting band, the controller can re-sweep the most recently swept frequency band. In some embodiments, the controller can perform a secondary sweep in reverse order, rather than resetting to the initial frequency band. For example, if the LD determines that a near lock occurred at Band 2 and Band 3, but not at Band 4, the controller can re-sweep in reverse order starting at Band 3, then going to Band 2, if necessary. In one or more embodiments, the direction of the sweep can be changed (e.g., from forward to reverse, or vice versa) through changing the current sources I1 and I2's current draw configuration, which may be changed through one or more corresponding registers.

CONCLUSION

From the foregoing, it will be appreciated that specific embodiments of the present disclosure have been described herein for purposes of illustration, but that various modifications can be made without deviating from the present disclosure. In representative embodiments, the CDR circuit can have configurations other than those specifically shown and described herein, including other electrical layouts. The various components and circuits described herein may have other configurations in other embodiments, which also produce the desired characteristics (e.g., pull up or pull down) described herein.

Certain aspects of the present disclosure described in the context of particular embodiments may be combined or eliminated in other embodiments. Further, while advantages associated with certain embodiments of the present disclosure have been described in the context of those embodiments, other embodiments may also exhibit such advantages, and not all embodiments need necessarily exhibit such advantages to fall with within the scope of the present disclosure. Accordingly, the disclosed techniques can encompass other embodiments not expressly shown or described herein. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times. Further, any specific numbers noted herein are only examples: alternative implementations may employ differing values or ranges.

The terms used in this specification generally have their ordinary meanings in the art, within the context of the disclosure, and in the specific context where each term is used. Certain terms that are used to describe the disclosure are discussed above, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given above. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

From the foregoing, it will be appreciated that specific embodiments of the invention have been described herein for purposes of illustration, but that various modifications may be made without deviating from the scope of the invention. Accordingly, the invention is not limited except as by the appended claims.

What is claimed is:

1. A circuit for clock and data recovery (CDR), comprising:
   a phase detector configured to generate one or more charge pump control signals based on a phase difference between an input signal and an output clock signal;
   a charge pump comprising a first current source configured to pull up an oscillator control signal towards a first predetermined voltage; and a second current source configured to pull down the oscillator control signal towards a second predetermined voltage, wherein the charge pump is operable to pull up or pull down the oscillator control signal towards the first predetermined voltage or the second predetermined voltage, and wherein the first current source is configured to generate a first driving current and the second current source is configured to generate a second driving current that is higher than or lower than the first driving current in amplitude;
   a voltage-controlled oscillator (VCO) configured to generate the output clock signal based on the oscillator control signal;
   a lock detector configured to detect a lock status based on a comparison between the oscillator control signal and a VCO reference voltage; and
   a control circuit configured to selectively switch a first frequency band of the VCO to a second frequency band based on the lock status, wherein the first frequency band of the VCO corresponds to a first range of frequencies associated with the output clock signal, and wherein the second frequency band of the VCO corresponds to a second range of frequencies associated with the output clock signal that are different from the first range.

2. The circuit of claim 1, wherein the charge pump is configured to cause the VCO to sweep through frequencies available in the first frequency band before switching to the second frequency band by driving the oscillator control signal from the first predetermined voltage to the second predetermined voltage.

3. The circuit of claim 2, wherein the second frequency band is a frequency band, among all available frequency bands, having a starting frequency that is the closest to a starting frequency of the first frequency band.

4. The circuit of claim 1, wherein the control circuit is configured to start a frequency sweep by setting the first frequency band of the VCO to an initial frequency band, and the oscillator control signal to the first predetermined voltage.

5. The circuit of claim 4, wherein the control circuit is configured to, when the VCO switches to the second frequency band, set the oscillator control signal back to the first predetermined voltage.

6. The circuit of claim 5, wherein the control circuit is configured to, after sweeping all available frequency bands, reset the VCO back to the initial frequency band to start a second frequency sweep.

7. The circuit of claim 1, wherein the current sources are so arranged that the charge pump has a pull down tendency, and wherein an initial frequency band is one that has a highest starting frequency among all available frequency bands.

8. The circuit of claim 7, wherein the lock detector is configured to detect that the circuit is locked when the circuit is settled and the oscillator control signal is higher than the VCO reference voltage.

9. The circuit of claim 8, wherein a highest available oscillator control signal for each frequency band of the available frequency bands is the first predetermined voltage, and wherein the VCO reference voltage is ½ the first predetermined voltage.

10. The circuit of claim 1, wherein the current sources are so arranged that the charge pump has a pull up tendency, and wherein an initial frequency band is one that has a lowest starting frequency among all available frequency bands.

11. The circuit of claim 10, wherein the lock detector is configured to detect that the circuit is locked when the circuit is settled and the oscillator control signal is lower than the VCO reference voltage.

12. The circuit of claim 11, wherein a lowest available oscillator control signal for each frequency band of the available frequency bands is the second predetermined voltage, and wherein the VCO reference voltage is ½ the first predetermined voltage.

13. The circuit of claim 1, wherein the control circuit is configured to determine whether the circuit has settled based on a comparison between a frequency of the output clock signal and a frequency of the input signal.

14. The circuit of claim 1, wherein all available frequency bands together represent a total operable frequency range of the circuit.

15. The circuit of claim 1, wherein the first and second current sources have at least 20% of difference in amplitude in their respective driving currents.

16. The circuit of claim 1, further comprising:
   a loop filter coupled to the oscillator control signal.

17. The circuit of claim 1, wherein the circuit operates without a crystal.

18. The circuit of claim 1, wherein the circuit operates without a frequency detector.

19. The circuit of claim 1, wherein the VCO reference voltage is adjustable, and wherein the VCO reference voltage is adjusted when a difference between the oscillator control signal and the VCO reference voltage is higher than a threshold.

20. A method for operating a circuit for clock and data recovery (CDR), comprising:
   receiving, by a phase detector, an input signal and an output clock signal;
   generating, by the phase detector, one or more charge pump control signals based on a phase difference between the input signal and the output clock signal;
   generating, by a charge pump comprising (i) a first current source configured to pull up an oscillator control signal towards a first predetermined voltage and (ii) a second current source configured to pull down the oscillator control signal towards a second predetermined voltage, the oscillator control signal, wherein the first current source is configured to generate a first driving current and the second current source is configured to generate a second driving current that is higher than or lower than the first driving current in amplitude;

generating, by a voltage-controlled oscillator (VCO), the output clock signal based on the oscillator control signal;

determining, by a lock detector, a lock status based on a comparison between the oscillator control signal and a VCO reference voltage; and providing, by a control circuit and based on the lock status, one or more controls to selectively switch a first frequency band of the VCO to a second frequency band, wherein the first frequency band of the VCO corresponds to a first range of frequencies associated with the output clock signal, and wherein the second frequency band of the VCO corresponds to a second range of frequencies associated with the output clock signal that are different from the first range.

\* \* \* \* \*